(12) United States Patent
Chen et al.

(10) Patent No.: US 10,595,433 B2
(45) Date of Patent: Mar. 17, 2020

(54) RACK PDU BRACKET WITH ROTATION FUNCTION

(71) Applicant: QUANTA COMPUTER INC., Taoyuan (TW)

(72) Inventors: Chao-Jung Chen, Taoyuan (TW); Chih-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/003,290

(22) Filed: Jun. 8, 2018

(65) Prior Publication Data

US 2019/0215982 A1 Jul. 11, 2019

Related U.S. Application Data

(60) Provisional application No. 62/613,863, filed on Jan. 5, 2018.

(51) Int. Cl.
| H05K 7/14 | (2006.01) |
| H05K 7/18 | (2006.01) |
| G06F 1/18 | (2006.01) |

(52) U.S. Cl.
CPC .......... *H05K 7/1492* (2013.01); *G06F 1/189* (2013.01); *H05K 7/1489* (2013.01); *H05K 7/183* (2013.01)

(58) Field of Classification Search
CPC .............................. H05K 7/1492; G06F 1/189
See application file for complete search history.

(56) References Cited

U.S. PATENT DOCUMENTS

| 6,229,691 | B1 | 5/2001 | Tanzer et al. | |
| 6,498,716 | B1 * | 12/2002 | Salinas | G06F 1/189 307/150 |
| 7,196,900 | B2 * | 3/2007 | Ewing | H02B 1/306 174/59 |
| 7,535,696 | B2 * | 5/2009 | Ewing | H02B 1/306 175/50 |
| 7,567,430 | B2 * | 7/2009 | Ewing | H01H 85/0241 174/50 |
| 7,718,889 | B2 * | 5/2010 | Rasmussen | G06F 1/189 174/50 |
| 8,038,015 | B2 * | 10/2011 | Laursen | H04Q 1/09 211/26 |
| 8,107,225 | B2 * | 1/2012 | Rasmussen | G06F 1/189 174/50.52 |

(Continued)

FOREIGN PATENT DOCUMENTS

| JP | 2013539876 A | 10/2013 |
| WO | 2013027285 A1 | 2/2013 |

OTHER PUBLICATIONS

Extended European Search Report for EP Application No. 18215667.9, dated Jun. 5, 2019.

(Continued)

*Primary Examiner* — Robert J Hoffberg
(74) *Attorney, Agent, or Firm* — Nixon Peabody LLP; Zhou Lu

(57) ABSTRACT

A rack is provided that includes a top frame and a bottom frame connected by at least one post. The rack also includes a power distribution assembly connected to the at least one post by a mounting bracket. The power distribution assembly is rotatable about the mounting bracket at a hinge.

9 Claims, 7 Drawing Sheets

(56) References Cited

U.S. PATENT DOCUMENTS

| | | | |
|---|---|---|---|
| 8,238,080 B2 * | 8/2012 | McGinn | H05K 7/1492 307/112 |
| 8,400,765 B2 * | 3/2013 | Ross | H05K 7/20727 361/679.33 |
| 8,416,565 B1 * | 4/2013 | Ross | H05K 7/1492 248/551 |
| 8,418,974 B2 * | 4/2013 | Felcman | G06F 1/188 211/26 |
| 8,472,183 B1 * | 6/2013 | Ross | H05K 7/20736 361/679.48 |
| 8,477,491 B1 * | 7/2013 | Ross | H05K 7/20736 361/679.48 |
| 9,122,462 B2 * | 9/2015 | Ross | H05K 7/20727 |
| 9,155,220 B2 * | 10/2015 | Yokosawa | H05K 7/183 |
| 9,282,660 B2 * | 3/2016 | Bailey | H05K 5/023 |
| 9,466,954 B1 * | 10/2016 | Stevens | G06F 1/189 |
| 9,535,469 B2 * | 1/2017 | Zhang | G06F 1/189 |
| 9,635,776 B2 * | 4/2017 | Li | H05K 7/1489 |
| 9,727,100 B1 * | 8/2017 | Eaton | G06F 1/189 |
| 9,820,408 B2 * | 11/2017 | Ross | H05K 7/20727 |
| 10,058,005 B1 * | 8/2018 | Willard | H05K 7/1489 |
| 10,098,262 B2 * | 10/2018 | Ross | H05K 7/20727 |
| 10,342,161 B2 * | 7/2019 | Ross | H05K 7/20727 |
| 2012/0069514 A1 | 3/2012 | Ross | |
| 2014/0144858 A1 | 5/2014 | Yokosawa et al. | |
| 2017/0164504 A1 * | 6/2017 | Blume | H05K 7/1487 |
| 2017/0201076 A1 * | 7/2017 | Chen | H05K 7/1492 |
| 2017/0372578 A1 * | 12/2017 | Klein | A62C 3/16 |
| 2019/0045667 A1 * | 2/2019 | Ross | H05K 7/20727 |
| 2019/0246513 A1 * | 8/2019 | Chen | H05K 7/183 |

OTHER PUBLICATIONS

JP Office Action for Application No. 2018-238519, dated Dec. 3, 2019, w/ First Office Action Summary.

* cited by examiner

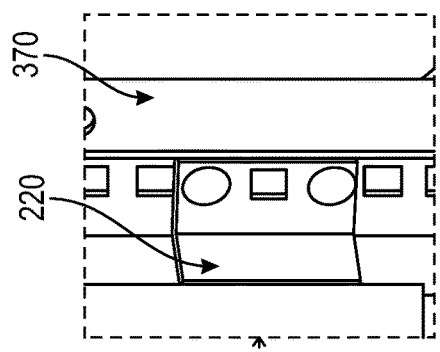
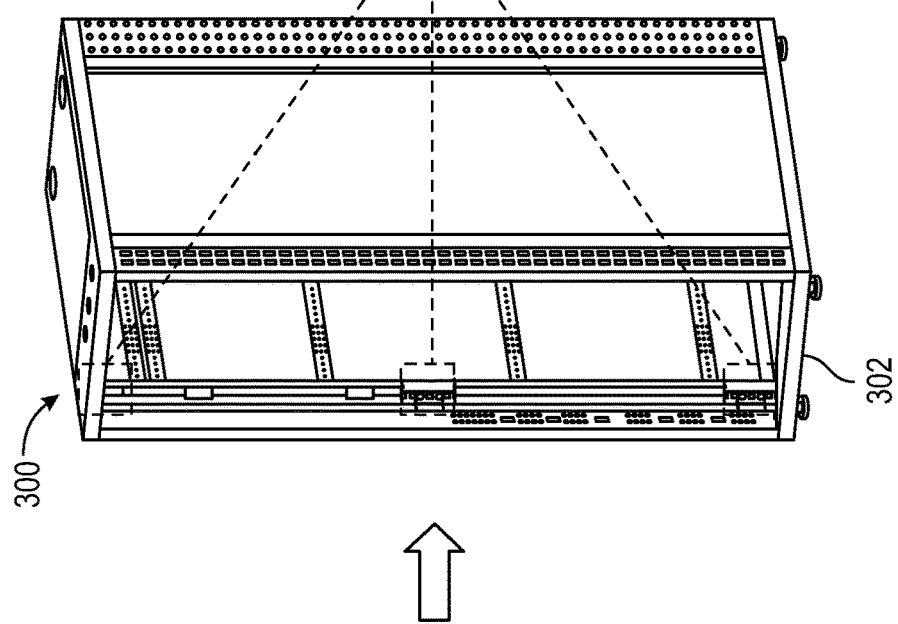
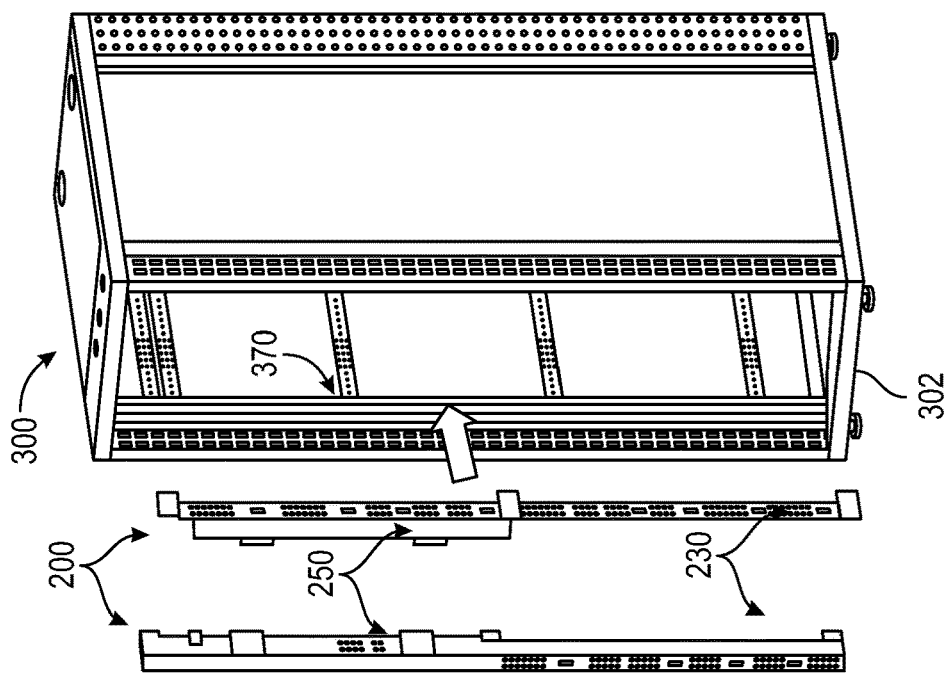

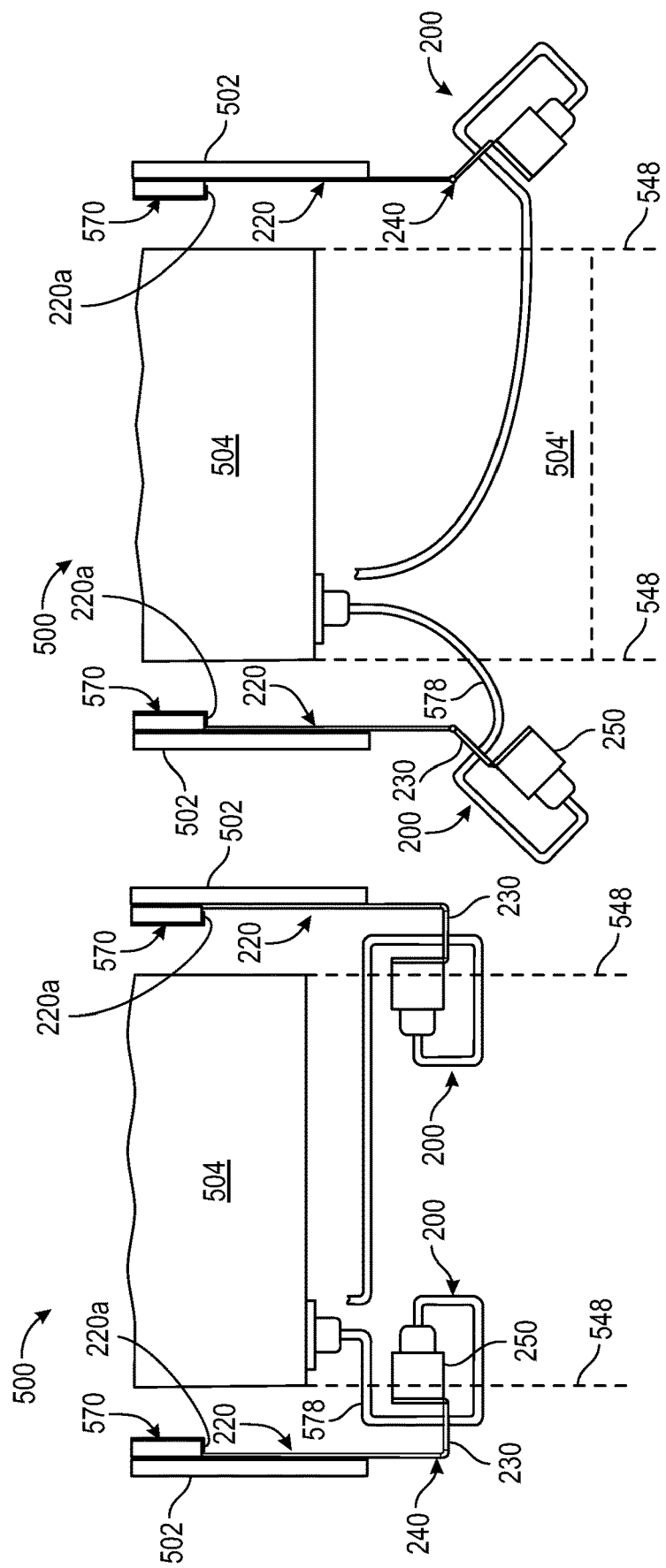

RACK PDU BRACKET WITH ROTATION FUNCTION

PRIORITY

This application claims priority under 35 U.S.C. § 119 to U.S. Provisional Application No. 62/613,863, entitled "RACK PDU BRACKET WITH ROTATION FUNCTION", and filed on Jan. 5, 2018. The contents of that application are hereby incorporated by reference in their entirety.

FIELD OF THE INVENTION

The disclosed embodiments relate to the design of an electronics rack with a rotatable power distribution unit (PDU) that can be moved to create an access space to service other components in the electronics rack.

BACKGROUND

In a data center environment, server racks are typically arranged so that one end faces a hot aisle and another end faces a cold aisle. This arrangement is provided so that a technician can comfortably service the components in the server rack via the cold aisle. Therefore, in the typical data center configuration, the server racks are typically arranged so that the cold aisle is at the front of the rack and the hot aisle is at the back.

Such a configuration is advantageous when front-access servers and switches are used. In front-access servers and switches, the connections for power cables (or "cords") and ports are located at the front of the server. Front-access arrangements are advantageous because of the convenience of having most or all connections on the same side of the server or switch.

However, in many conventional server rack arrangements, power distribution units (PDUs) are typically located at the back of the server. It is difficult for a technician to identify the correct power cable when he is unable to see both ends of power cable at the same time. For example, when the PDUs are located at the back of the rack, and the server and switch power ports are located at the front of the rack, it is difficult to determine which power cable at the rear PDU corresponds to which front server or switch. As the depth of the server rack increases, this problem is exacerbated.

Although the logical solution is to move the PDU to the front of the server rack, conventional server racks typically do not have sufficient space at the front of the rack for a PDU. However, even if such space existed, mounting a PDU to the front of a rack would interfere with the servicing, installing, and uninstalling of servers in the server rack.

SUMMARY

The various embodiments concern a rotatable power distribution assembly for enabling service of a server by creating an access space without disconnecting the power cables that connect the power distribution unit to the electronic components in the rack. The rack includes a top frame and a bottom frame connected by at least one post. The rack also includes a power distribution assembly connected to the at least one post by a mounting bracket. The power distribution assembly is rotatable about the mounting bracket at a hinge.

In some embodiments, the rack includes an ambient side and a heated side of the rack. The power distribution unit is located at the ambient side of the rack. Furthermore, the power distribution assembly can include a power distribution unit. The power distribution unit can include a plurality of receptacles. The power distribution unit can be connected to the power distribution assembly by a bracket. The hinge can include first and second hinge elements. The first hinge element can be located on the mounting bracket. The second hinge element can be located on the power distribution assembly.

In some embodiments, the rack can also include a second power distribution assembly connected to a second post. The initial power distribution assembly and the second distribution assembly can be located on a front side of the rack. In some embodiments, the rack further includes a third power distribution assembly connected to a third post, and a fourth power distribution assembly connected to a fourth post. The third power distribution assembly and the fourth distribution assembly can be located on a back side of the rack, opposite the initial power distribution assembly and the second distribution assembly. The rack can also include a server chassis. The power distribution assembly can be installed at the power supplies of the server chassis.

In some embodiments, the power distribution assembly is rotatable about an operating position. When the power distribution assembly is in the operating position, the power distribution assembly is in an installation/removal path of the server chassis. In alternative embodiments, the power distribution assembly is rotatable about a maintenance position. When the power distribution assembly is in the maintenance position, power cables connected to the server chassis can uncoil relative to a rotation axis of the hinges.

Additional features and advantages of the various embodiments will be set forth in the description that follows, and in part, will be obvious from the description; or can be learned by practice of the herein disclosed principles. The features and advantages of the various embodiments can be realized and obtained by means of the instruments and combinations particularly pointed out in the appended claims.

BRIEF DESCRIPTION OF THE DRAWINGS

In order to describe the manner in which the above-recited disclosure and its advantages and features can be obtained, a more particular description of the principles briefly described above will be rendered by reference to specific examples illustrated in the appended drawings. These drawings depict only exemplary embodiments, and are therefore not to be considered to be limiting of the scope of the various embodiments or the claims. The principles are described and explained with additional specificity and detail through the use of the following drawings.

FIG. 3A illustrates an exploded view of a rack and the rotatable power distribution unit of FIG. 2, according to one or more embodiments.

FIG. 3B illustrates an assembled view of the rack and the rotatable power distribution unit, according to one or more embodiments.

FIG. 3C illustrates an exemplary connection of a mount bracket of the rotatable power distribution unit connected to a rack post, according to one or more embodiments.

FIG. 5A is a top view schematic illustrating one embodiment of a rack system with rack power distribution assemblies in an operating position.

FIG. 5B is a top view schematic illustrating one embodiment of a rack system with rack power distribution assemblies in a maintenance position.

DETAILED DESCRIPTION

Figure 1A:
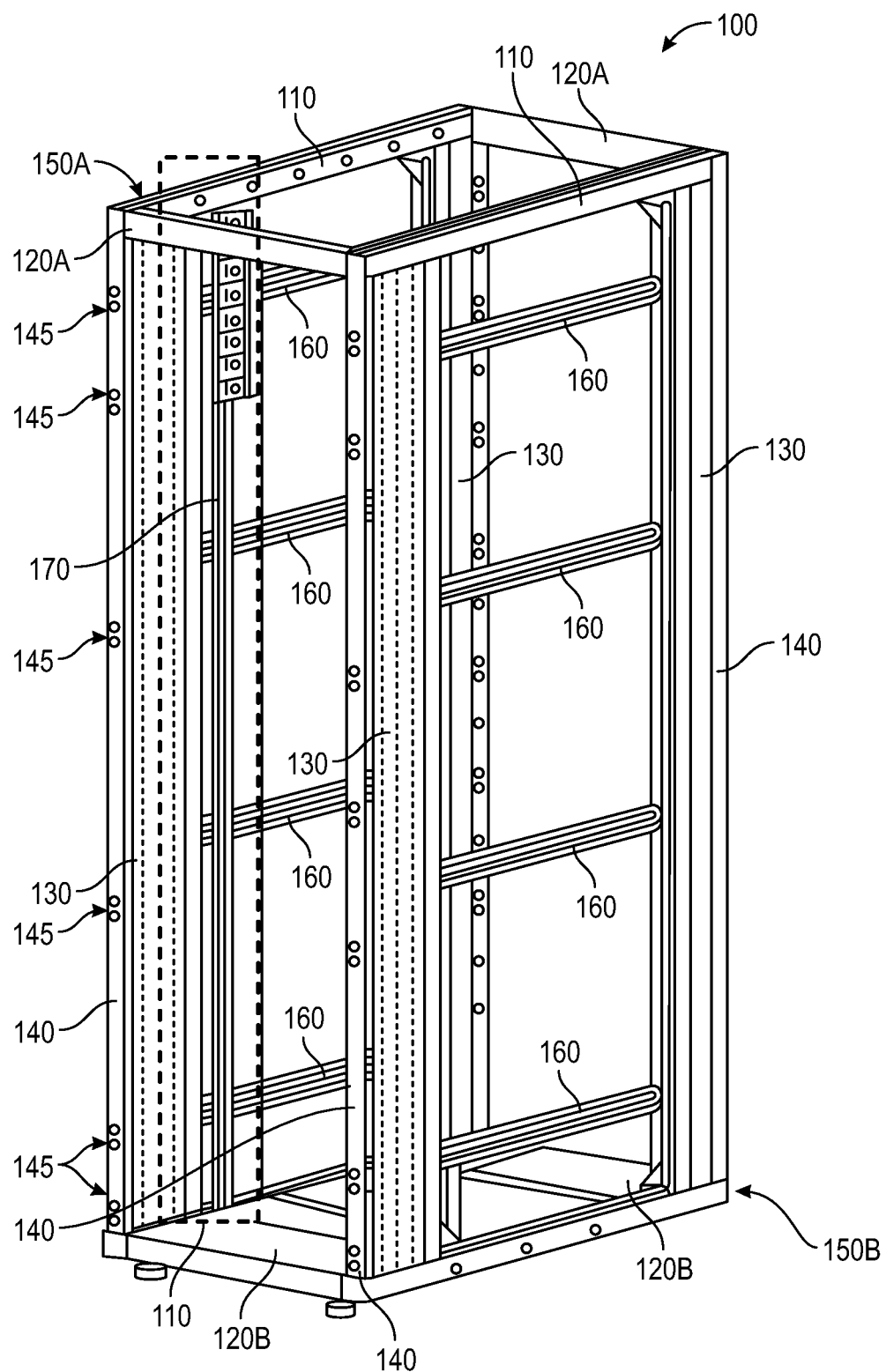
FIG. 1A illustrates a front perspective view of a conventional rack 100 as known in the art.

The various embodiments are described with reference to the attached figures, wherein like reference numerals are used throughout the figures to designate similar or equivalent elements. The figures are not drawn to scale, and they are provided merely to illustrate the various embodiments. Several embodiments are described below with reference to example applications for illustration. It should be understood that numerous specific details, relationships, and methods are set forth to provide a full understanding of the various embodiments. One having ordinary skill in the relevant art, however, will readily recognize that the various embodiments can be practiced without one or more of the specific details or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the various embodiments.

As used herein, "power distribution assembly" means any device, module, component, or combination thereof, that can be used to distribute electrical power. The elements of a power distribution assembly may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, a "rack" means a rack, container, frame, or other element or combination of elements that can contain or physically support one or more computer systems.

In general, the various embodiments are directed to a rotatable power distribution assembly within a rack server. In one or more implementations, the rotatable power distribution assembly enables an operator to rotate the power distribution assembly in and out of the rack when servicing or replacing a server. As a result, the rotatable power distribution unit allows service of the server by creating an access space for the server without disconnecting the power cables that connect the power distribution assembly to the electronic components in the rack.

Moreover, the rotatable power distribution assembly can be located at the front of the rack. This alleviates the difficulty in determining which power cable at the rear power distribution assembly corresponds to which front server or switch. Additionally, locating the rotatable power distribution unit at the front of the rack can reduce power cable lengths and related costs.

FIG. 1A illustrates a front perspective view of a conventional rack 100 as known in the art. The rack 100 may be one of a plurality of racks installed in a data center. The rack 100 includes front-to-back beams 110, top side-to-side beams 120A, bottom side-to-side beams 120B, vertical posts 130, rail assemblies 160, post 170, and face plates 140. The front-to-back beams 110 and the top side-to-side beams 120A are connected to form a top frame 150A. Similarly, the front-to-back beams 110 and the bottom side-to-side beams 120B are connected to form a bottom frame 150B. In some embodiments, the front-to-back beams 110 are permanently connected to the side-to-side beams 120A, 120B, using for example, permanent connectors such as rivets and welds. In alternative embodiments, the front-to-back beams 110 are removably connected to the side-to-side beams 120A, 120B, using for example, removable connectors or fasteners, such as nuts and bolts, screws, or the like.

The vertical posts 130 are connected to the top and bottom frames 150A, 150B to form the rack 100. Specifically, the vertical posts 130 are connected to the side-to-side beams 120A, 120B. In some embodiments, the vertical posts 130 are removably connected to the side-to-side beams 120A, 120B, using for example, removable connectors, such as nuts and bolts and screws. In alternative embodiments, the vertical posts 130 are permanently connected to the side-to-side beams 120A, 120B, using for example, permanent connectors, such as rivets and welds.

In some embodiments, the face plates 140 are removably connected to the side-to-side beams 120A, 120B and vertical posts 130, using for example, removable connectors, such as nuts and bolts and screws. In alternative embodiments, the face plates 140 are permanently connected to side-to-side beams 120A, 120B, using for example, permanent connectors, such as rivets and welds. The face plates 140 provide additional stiffness to the rack 100, and more particularly, to the side-to-side beams 120A, 120B and vertical posts 130.

The rail assemblies 160 are connected to the vertical posts 130 of the rack 100. In some embodiments, the rail assemblies 160 are removably connected to the vertical posts 130, using for example, removable connectors, such as nuts and bolts and screws. In alternative embodiments, the rail assemblies 160 are permanently connected to the vertical posts 130, using for example, permanent connectors, such as rivets and welds.

Figure 1B:
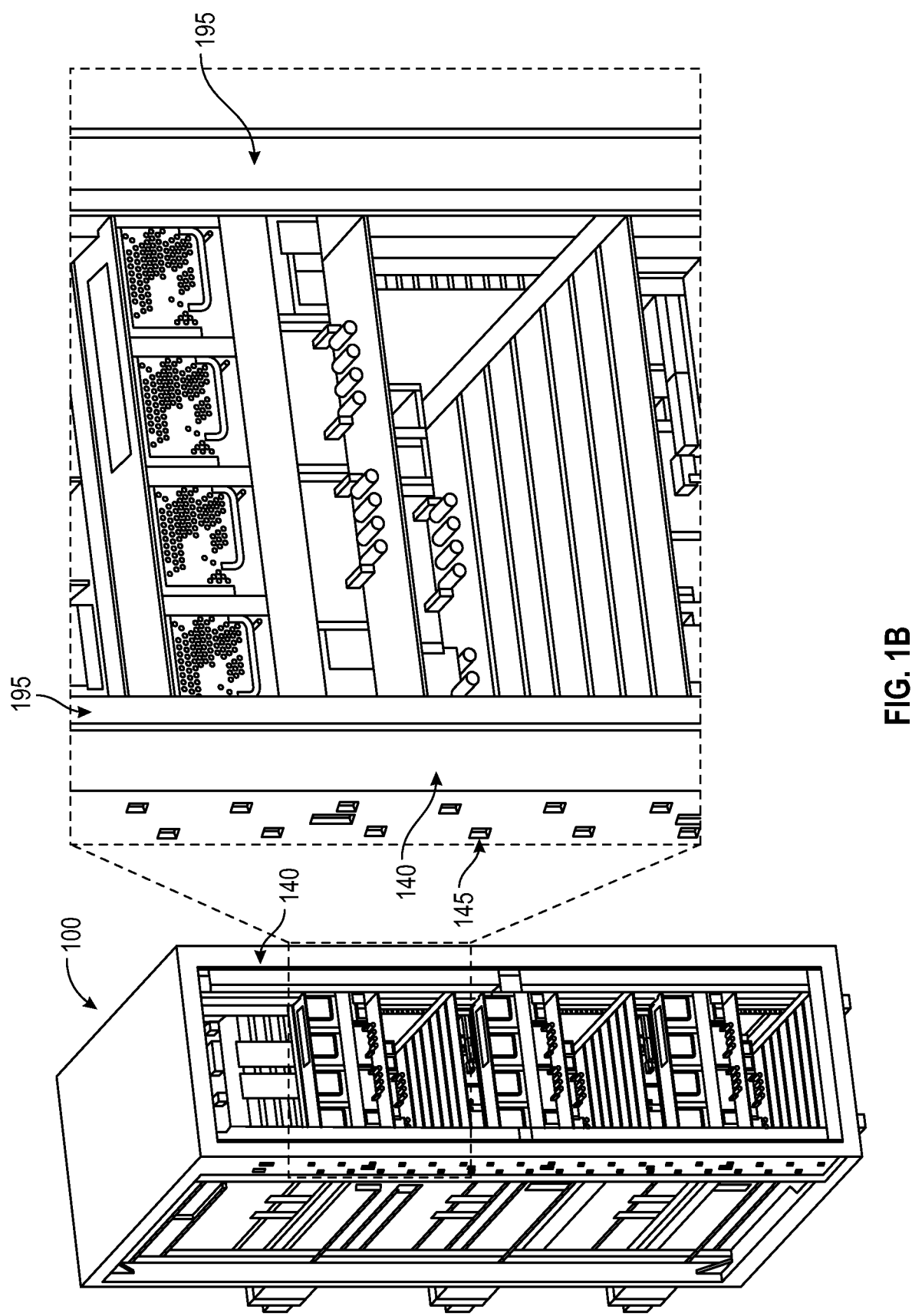
FIG. 1B illustrates a rear perspective view of a conventional rack 100 as known in the art.

FIG. 1B illustrates a rear perspective view of the conventional rack 100 as known in the art. The face plates 140 are located at the rear of the rack 100. The face plates 140 includes one or more mounting slots 145 connected to the rack 100. A single PDU 195 can be mounted using the one or more of mounting slots 145. The post 170 (shown in FIG. 1A) has similar PDU mounting slots (not shown). Heated air is expelled through the rear of a server chassis and then exits through the rear of the rack 100 into a hot aisle. The mounting slots 145 enable assembly of electrical connections for power and data, along with associated equipment for the electrical connections such as rack-level power distribution units. With the electrical connections located at the hot end of the rack 100, personnel may be forced to work in a hot environment to maintain the servers (for example, to connect and disconnect power and data cables). In addition, high temperatures at the rear of the rack 100 may cause failures in the rack-level power distribution units (for example, due to thermal overload of breakers in the power distribution units).

Figure 2:
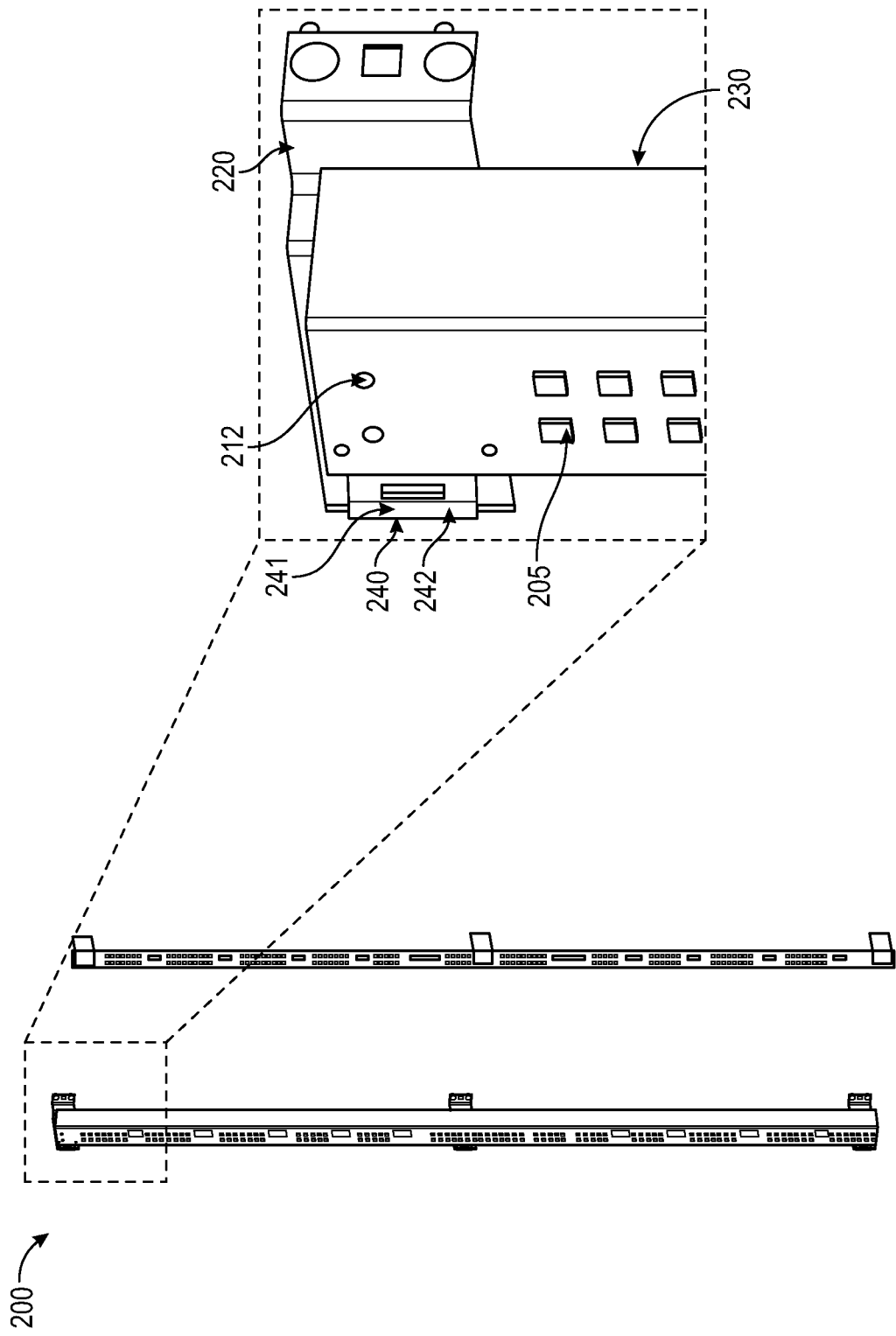
FIG. 2 illustrates a perspective view of a rotatable power distribution unit, according to one or more embodiments.

FIG. 2 illustrates a perspective view of a rotatable power distribution assembly 200, according to one or more embodiments. In some embodiments, the rotatable power distribution assembly 200 may be provided at the air intake side of a rack (not shown). The rotatable power distribution assembly 200 can be at the same end of the rack as the connections for power supplies for servers in the rack. The rotatable power distribution assembly 200 can be attached to a rack by way of a coupling device. In some embodiments, the coupling device allows for movement or repositioning of the rack power distribution unit, for example, during maintenance operations. The coupling device of the rotatable power distribution assembly 200 can include hinges 240, mounting brackets 220, bracket 230, slots 205, and fasteners 212.

The rotatable power distribution assembly 200 also includes a power distribution unit 250. Rack power distribution unit 250 is mounted on the bracket 230. The bracket 230 can serve as coupling device for the power distribution unit 250. The bracket 230 is coupled to a rack by way of hinges 240 and mounting brackets 220. The power distribution unit 250 can be coupled to the bracket 230 by engagement with slots 205. For example, the power distribution unit 250 can have corresponding engagement members or hooks that allow for a tool-less connection between the power distribution unit 250 and the bracket 230. In other embodiments, the power distribution unit 250 and the bracket 230 can be permanently connected using permanent connectors, such as rivets and welds.

The mounting brackets 220 can facilitate a connection between the rotatable power distribution assembly 200 and the rack. This is explained in more details below with respect to FIGS. 5A and 5B. The mounting brackets 220 can extend the rotatable power distribution assembly 200 from the rack. In this way, the mounting brackets 220 provide sufficient spacing to rotate the bracket 230 in and out of the rack so as to allow components installed in the rack to be easily removed without interference of the bracket 230. Furthermore, the mounting brackets 220 allow the rotatable power distribution assembly 200 to be installed in pre-existing rack designs. Each of hinges 240 include a hinge element 241 and a hinge element 242. The hinge elements 242 can be located on the mounting bracket 220. The hinge element 241 can be located on the bracket 230. The hinge elements 241 and 242 can be configured to form a hinge 240 between the mounting bracket 220 and the bracket 230. The power distribution unit 250 can rotate on hinges 240 at a distance from the rack defined by mounting bracket 220.

In certain embodiments, the hinge elements 241 and 242 can be formed from sheet metal as an integral part the mounting bracket 220 and the bracket 230. In other embodiments, hinge elements 241 and 242 can be produced as a separate part and then attached to the mounting bracket 220 and the bracket 230, for example, by rivets, screws, or welding.

FIGS. 3A-3C schematically illustrates a perspective view of a rack 300 and the rotatable power distribution assembly 200 of FIG. 2, according to one or more embodiments. FIG. 3A is an exploded view of the rack 300 and the rotatable power distribution assembly 200; FIG. 3B is an assembled view; and FIG. 3C illustrates the connection between the two. The rack 300 includes rotatable power distribution assembly 200 on the left and right sides of the rack 300 at the front 302 of the rack 300. Each of the rotatable power distribution assemblies 200 can include a power distribution unit 250. The power distribution unit 250 can include any number of receptacles (outlets).

Figure 4A:
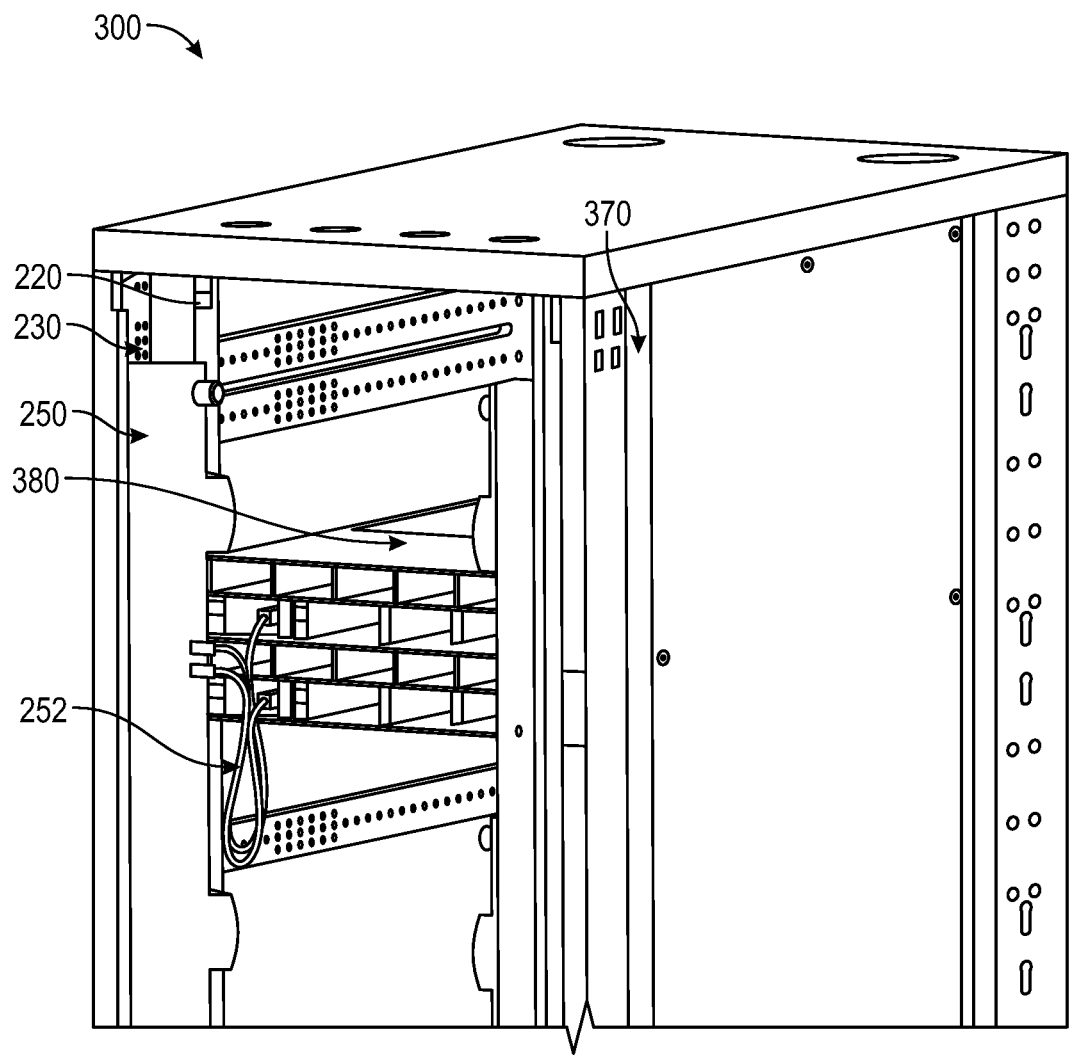
FIG. 4A illustrates a perspective view of the rotatable power distribution unit of FIG. 3A and the exemplary server chassis 380, according to one or more embodiments.

FIG. 4A illustrates a perspective view of the rotatable power distribution unit of FIG. 3A and the exemplary server chassis 380. The power distribution unit 250 can receive input power through a cable 252. The cable 252 can be connected to a bus bar (not shown) located at the rack 300. Each of receptacles in the power distribution unit 250 can be coupled to a different computer system in the rack 300 by way of one of power cables 252. As discussed above with respect to FIG. 2, the power distribution unit 250 is mounted on the bracket 230. The brackets 230 include hinges 240 (shown in FIG. 2) to allow for rotatable connection to the mounting bracket 220. The mounting bracket 220 can be coupled to a rack post 370 of the rack 300.

Figure 4B:
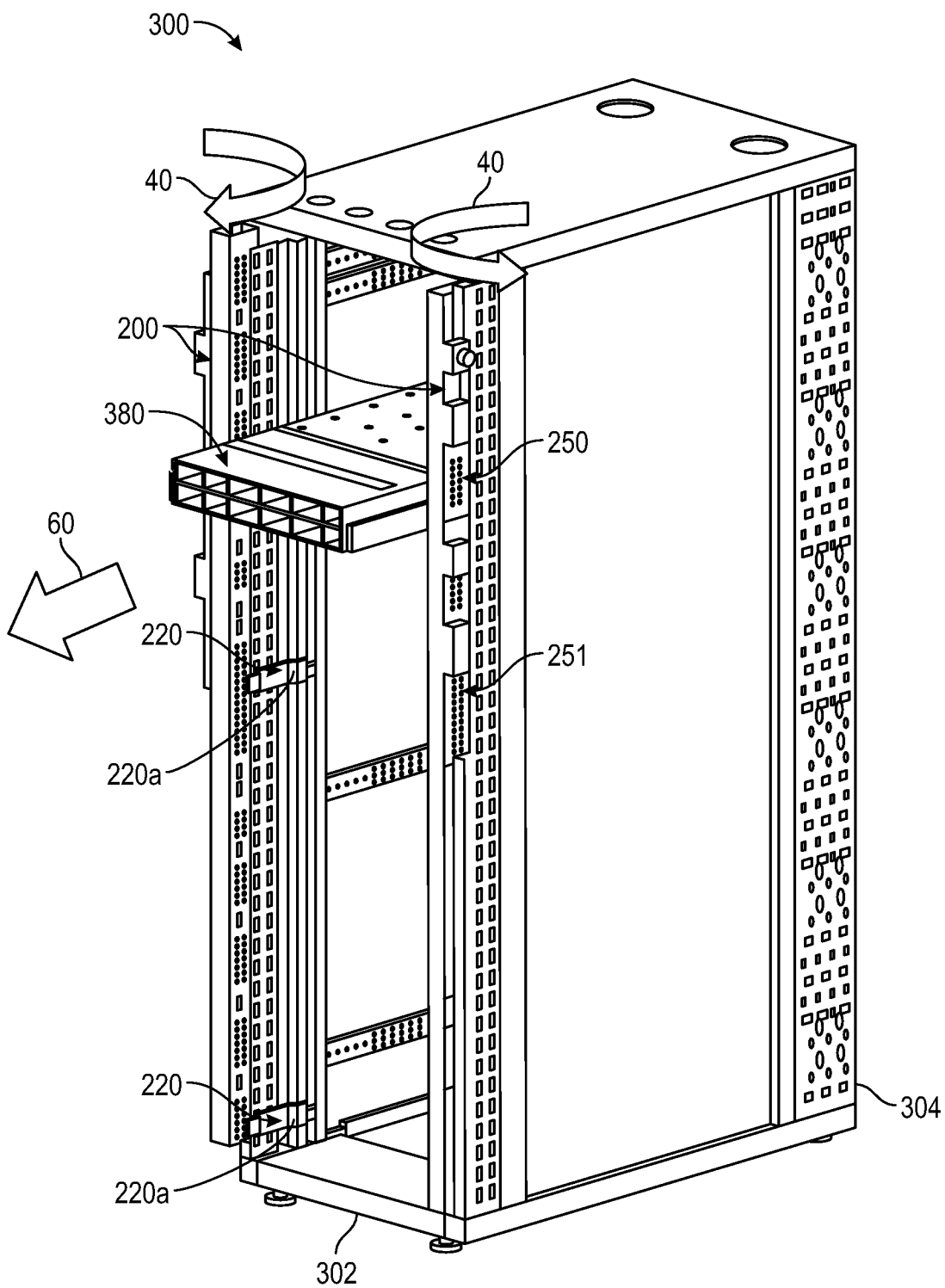
FIG. 4B illustrates a perspective view of the function of the rotatable power distribution unit of FIG. 3A while removing an exemplary server chassis from the rack, according to one or more embodiments.

FIG. 4B illustrates a perspective view of the function of the rotatable power distribution unit of FIG. 3A while removing an exemplary server chassis 380 from the rack 300. The power distribution unit 250 include PDU output receptacles 251. The power distribution unit 250 can supply power to computer systems located on the server chassis 380. For each computer system, one of power cables can couple one of PDU output receptacles 251 in the power distribution unit 250.

Power connectors for a power cable and the corresponding receptacles on a rack power distribution unit and power supply may be any of various connector types. In one embodiment, the power distribution unit 250 has IEC C13 receptacles and the power supply units have IEC C14 receptacles. The power distribution unit 250 can have any suitable power characteristics. Examples of output voltages for the power distribution unit 250 include 100 volts, 110 volts, 208 volts, and 230 volts. In certain embodiments, each of receptacles in the power distribution unit 250 is on one phase of three-phase input power to the power distribution unit 250.

The server chassis 380 can be rack-mountable in rack 300. For example, rails can be installed on the left and right sides of the server chassis 380 to engage on corresponding rails, slides, or ledges. In certain embodiments, a rail kit can be installed on the left and right sides of the server chassis 380.

Although only one server chassis 380 is shown installed in rack 300 in FIG. 4 for clarity, a rack system can, in various embodiments, have any number of server chasses. For example, rack 300 can hold a server chassis 380 in each 1 U position in rack 300. In one embodiment, a rack system has about 20 1 U computer systems.

The rotatable power distribution assemblies 200 are coupled to rack 300 by way of hinges 240 and mounting brackets 220. When rotatable power distribution assemblies 200 are in an operating position (as shown, for example, in FIG. 3B), the power distribution unit 250 are in the installation/removal path of server chassis 380. This is discussed in more detail below with respect to FIGS. 5A-5B. The rotatable power distribution assemblies 200 can be repositioned to a maintenance position by rotating in direction 40. In the maintenance position, the power distribution assemblies 200 are rotated outward in direction 40 such that they are not in the installation/removal path of server chassis 380. As a result, maintenance on the server chassis 380 can easily be accomplished without the complete removal of the power distribution assemblies 200. (as shown, for example, in FIG. 4).

With the power distribution assemblies 200 in a maintenance position, the server chassis 380 be installed or removed from rack 300 in direction 60. In some embodiments, the power distribution assemblies 200 are provided on both ends of a rack 300. That is, the power distribution assemblies 200 can be located at the front 302 or the rear 304 of the rack 300. The power distribution assemblies 200 can be movable with respect to the rack 300 to facilitate access to servers in the rack.

FIG. 5A is a top view schematic illustrating one embodiment of a rack system 500 with rack power distribution assemblies 200 in an operating position. FIG. 5B is a top view schematic illustrating one embodiment of a rack system 500 with rack power distribution assemblies 200 in a maintenance position. The rack power distribution assembly 200 includes a rack power distribution unit 250. The rack system 500 also includes a rack 502 and a server chassis 504. The rack 502 includes a side panel forward of a post 570.

The rack power distribution assembly 200 also includes a bracket 230 configured to house the rack power distribution unit 250. The rack power distribution assembly 200 also includes a mounting bracket 220 having a planar segment abutting the side panel of the rack 502, one end attached to the hinge 240, and an opposite end having a perpendicular segment 220a connected to the post 570. The mounting bracket 220 is configured to connect the rack power distribution unit 250 to the post 570 of the rack 502. The rack power distribution unit 250 is mounted on the bracket 230. The bracket 230 is coupled to the mounting bracket 220 by a hinge 240.

When the rack power distribution units 250 are in an operating position (as shown, for example, in FIG. 5A), the rack power distribution units 250 and the brackets 230 are in the installation/removal path 548 of server chassis 504. The rack power distribution units 250 can be repositioned to a maintenance position (as shown, for example, in FIG. 5B). As the rack power distribution units 250 are rotated with respect to the mounting brackets 220 and subsequently the rack 502, power cables 578 can uncoil relative to the rotation axis of the hinge 240. Uncoiling and/or unwinding of power cables 578 will reduce or eliminate tension in the power cable 578 as the receptacles (not shown) on the rack power distribution unit 250 are swung away from server chassis 504.

With the rack power distribution units 250 in the maintenance position, the server chassis 504 can be installed or removed from the rack 502. For example, as shown in FIG. 5B, the server chassis 504 can be slid-out of rack 502 while the rack power distribution units 250 are in the maintenance position.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A rack comprising:
    a top frame and a bottom frame connected by at least one post;
    a side panel forward of the at least one post;
    a server device installed within the rack; and
    a power distribution assembly connected to the at least one post by a mounting bracket, wherein the mounting bracket is located at an interior portion of the rack, forward of the at least one post, wherein the power distribution assembly is rotatable about the mounting bracket at a hinge in and out of an installation/removal path of the server device, and wherein the mounting bracket includes a planar segment abutting the side panel, the planar segment having one end attached to the hinge and an opposite end having a perpendicular segment directly connected to the at least one post.

2. The rack of claim 1, further comprising an ambient side and a heated side of the rack, wherein the power distribution assembly is located at the ambient side of the rack.

3. The rack of claim 1, wherein the power distribution assembly comprises a power distribution unit comprising a plurality of receptacles, wherein the power distribution unit is coupled with a bracket.

4. The rack of claim 1, wherein the hinge comprises a first hinge element and a second hinge element, wherein the first hinge element is located on the mounting bracket, and the second hinge element is located on the power distribution assembly.

5. The rack of claim 1, wherein the rack comprises a second power distribution assembly connected to a second post, wherein the power distribution assembly and the second power distribution assembly are located on a front side of the rack.

6. The rack of claim 5, wherein the rack comprises a third power distribution assembly connected to a third post, and a fourth power distribution assembly connected to a fourth post, wherein the third power distribution assembly and the fourth power distribution assembly are located on a back side of the rack.

7. The rack of claim 1, wherein the power distribution assembly is rotatable about an operating position, wherein when the power distribution assembly is in the operating position, the power distribution assembly is in the installation/removal path of the server device.

8. A rotatable power distribution assembly comprising:
    a power distribution unit comprising a plurality of receptacles, wherein the power distribution unit is connected to a bracket; and
    a hinge configured to connect the bracket to a mounting bracket, wherein the rotatable power distribution assembly is rotatable about the mounting bracket at the hinge, wherein the mounting bracket is located at an interior portion of a rack having at least one post connecting a top frame to a bottom frame, wherein the mounting bracket includes a planar segment abutting a side panel of the rack forward of the at least one post, the planar segment having one end attached to the hinge and an opposite end having a perpendicular segment directly connected to the at least one post.

9. The rotatable power distribution assembly of claim 8, wherein the hinge comprises a first hinge element and a second hinge element, wherein the first hinge element is located on the mounting bracket, and the second hinge element is located on the bracket.

\* \* \* \* \*